(12) United States Patent
Yang et al.

(10) Patent No.: US 9,972,633 B2
(45) Date of Patent: May 15, 2018

(54) SEMICONDUCTOR DEVICE AND METHOD FOR FABRICATING THE SAME

(71) Applicant: United Microelectronics Corp., Hsinchu (TW)

(72) Inventors: Hui Yang, Singapore (SG); Chow-Yee Lim, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days. days.

(21) Appl. No.: 15/008,185

(22) Filed: Jan. 27, 2016

(65) Prior Publication Data

US 2017/0213839 A1    Jul. 27, 2017

(51) Int. Cl.
*H01L 29/788* (2006.01)
*H01L 27/11534* (2017.01)
*H01L 27/11521* (2017.01)
*H01L 27/11568* (2017.01)
*H01L 27/11573* (2017.01)
*H01L 29/51* (2006.01)
*H01L 29/45* (2006.01)
*H01L 21/02* (2006.01)

(52) U.S. Cl.
CPC .... *H01L 27/11534* (2013.01); *H01L 21/0217* (2013.01); *H01L 21/02164* (2013.01); *H01L 27/11521* (2013.01); *H01L 27/11568* (2013.01); *H01L 27/11573* (2013.01); *H01L 29/45* (2013.01); *H01L 29/513* (2013.01); *H01L 29/518* (2013.01)

(58) Field of Classification Search
CPC ......... H01L 27/11534; H01L 27/11521; H01L 27/11568; H01L 27/11573; H01L 21/02164; H01L 29/518; H01L 29/45; H01L 21/0217; H01L 29/513
USPC ......................................................... 257/316
See application file for complete search history.

(56) References Cited

U.S. PATENT DOCUMENTS

| | | | |
|---|---|---|---|
| 6,635,576 B1 * | 10/2003 | Liu .................... | H01L 21/31116 257/E21.252 |
| 8,389,358 B2 | 3/2013 | Shih et al. | |
| 2010/0221889 A1 * | 9/2010 | Youn ................. | H01L 27/10811 438/396 |
| 2011/0037103 A1 * | 2/2011 | Yamaguchi ..... | H01L 21/823807 257/255 |
| 2012/0142160 A1 * | 6/2012 | Han ................... | H01L 21/28176 438/381 |
| 2015/0091073 A1 | 4/2015 | Li et al. | |

* cited by examiner

*Primary Examiner* — Anthony Ho
*Assistant Examiner* — Mohammad H Hoque
(74) *Attorney, Agent, or Firm* — J.C. Patents

(57) ABSTRACT

A semiconductor device including a logic transistor, a non-volatile memory (NVM) cell and a contact etching stop layer (CESL) is shown. The CESL includes a first silicon nitride layer on the logic transistor but not on the NVM cell, a silicon oxide layer on the first silicon nitride layer and on the NVM cell, and a second silicon nitride layer disposed on the silicon oxide layer over the logic transistor and disposed on the silicon oxide layer on the NVM cell.

7 Claims, 1 Drawing Sheet

SEMICONDUCTOR DEVICE AND METHOD FOR FABRICATING THE SAME

BACKGROUND OF THE INVENTION

Field of Invention

This invention relates to an integrated circuit (IC), and particularly relates to a semiconductor device for a memory-including integrated circuit, and to a method for fabricating the same.

Description of Related Art

A non-volatile memory (NVM) or an NVM-embedded IC has logic transistors and flash memory cells therein. For the logic transistor and the NVM cell are different kinds of elements, they have different characteristics, and are difficult to integrate in a manner such that the requirements of both of them are met.

An example of such differences lies on the requirements on the contact etching stop layer (CESL), which is usually also given a function of applying stress to improve the performance of elements.

SUMMARY OF THE INVENTION

Accordingly, this invention provides a semiconductor device in which a logic transistor and a NVM cell are integrated well considering their requirements on CESL.

This invention also provides a method for fabricating the semiconductor device of this invention.

The semiconductor device of this invention includes a logic transistor, an NVM cell and a CESL is shown. The CESL includes a first silicon nitride (SiN) layer on the logic transistor but not on the NVM cell, a silicon oxide layer on the first SiN layer and on the NVM cell, and a second SiN layer disposed on the silicon oxide layer over the logic transistor and disposed on the silicon oxide layer on the NVM cell.

The method for fabricating the semiconductor device of this invention is described below. A substrate having a logic transistor and an NVM cell is provided. A CESL is then formed, including the following steps. A first SiN layer is formed on the logic transistor but not on the NVM cell. A silicon oxide layer is formed on the first SiN layer and on the NVM cell. A $2^{nd}$ SiN layer is formed on the silicon oxide layer over the logic transistor, and also on the silicon oxide layer on the NVM cell.

Since the first SiN layer in the CESL is formed on the logic transistor, sufficient stress can be applied to the latter to well improve the performance there. Meanwhile, since the first SiN layer is not formed on the NVM cell while the silicon oxide having less stress is formed on the same, the data retention capability of the NVM cell is not adversely affected.

In order to make the aforementioned and other objects, features and advantages of the present invention comprehensible, a preferred embodiment accompanied with figures is described in detail below.

DESCRIPTION OF EMBODIMENTS

This invention will be further explained with the following embodiment and the accompanying drawings, which are not intended to restrict the scope of this invention. For example, although the SPNVM cell being exemplified in the first embodiment has a structure as illustrated in FIG. 1, the SPNVM cell in this invention may alternatively have two serially connected MOS transistors.

Figure 1:
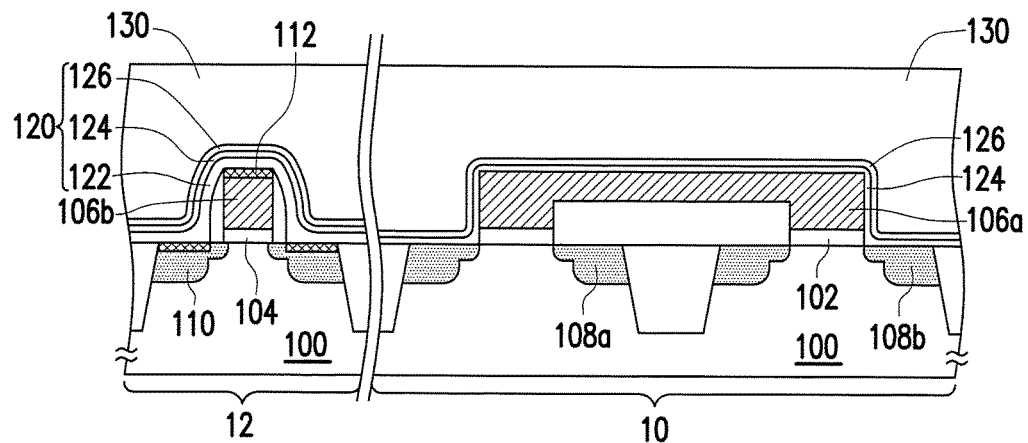
FIG. 1 illustrates a semiconductor device according to a first embodiment of this invention where the NVM cell includes a single-poly NVM (SPNVM) cell.

FIG. 1 illustrates a semiconductor device according to the first embodiment of this invention where the NVM cell includes an SPNVM cell.

Referring to FIG. 1, the semiconductor device includes an SPNVM cell 10 and a logic transistor 12. The SPNVM cell 10 includes a gate dielectric layer 102, a floating gate 106a covering the gate dielectric layer 102, doped regions 108a serving as a control gate in the substrate 100 beside a portion of the floating gate 106a, and source/drain (S/D) regions 108b in the substrate 100 beside another portion of the floating gate 106a. The logic transistor 12 includes a gate dielectric layer 104 that may be formed simultaneously with the gate dielectric layer 102 of the SPNVM cell 10, a gate 106b that is formed on the gate dielectric layer 104 simultaneously with the floating gate 106a of the SPNVM cell 10, and S/D regions 110 that may be formed simultaneously with the doped regions 108a and the S/D regions 108b of the SPNVM cell 10. A self-aligned silicide (salicide) layer 112 may be formed on the gate 106b and the S/D regions 110 of the logic transistor 12.

A CESL 120 is formed on the above structure, including a first SiN layer 122 on the logic transistor 12 but not on the SPNVM cell 10, a silicon oxide layer 124 on the first SiN layer 122 and on the SPNVM cell 10, and a second SiN layer 126 disposed on the silicon oxide layer 124 over the logic transistor 12 and disposed on the silicon oxide layer 124 on the NVM cell 10. The CESL 120 can be formed, after the above structure is provided, by steps comprising: forming the first SiN layer 122 on the logic transistor 12 but not on the SPNVM cell 10, forming the silicon oxide layer 124 on the first SiN layer 122 and on the SPNVM cell 10, and forming the second SiN layer 126 on the silicon oxide layer 124 over the logic transistor 12, and also on the silicon oxide layer 124 on the NVM cell 10. An inter-layer dielectric (ILD) layer 130 is then formed covering the resulting structure.

The first SiN layer 122 may have been subjected to UV-curing to serve as a stress film capable of improving the performance of logic transistor 12. The thickness of the first SiN layer 122 may be in the range of 400 to 700 angstroms. The silicon oxide layer 124 may be formed with PECVD. The thickness of the silicon oxide layer 124 may be in the range of 200 to 400 angstroms. The thickness of the second SiN layer 126 may be in the range of 200 to 400 angstroms. The ILD layer 130 usually includes silicon oxide.

Figure 2:
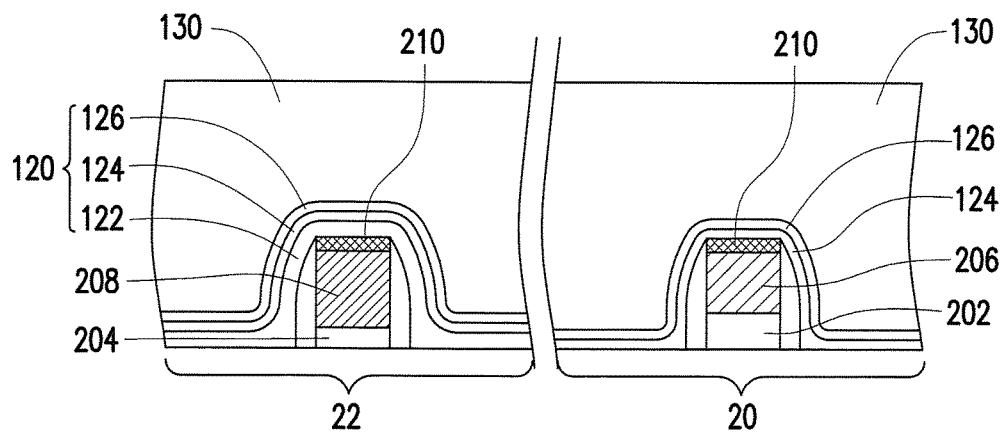
FIG. 2 illustrates a semiconductor device according to a second embodiment of this invention where the NVM cell includes a cell having a charge trapping layer or a cell having a stack of a floating gate and a control gate.

This invention may also be applied to an IC structure includes a logic transistor and another kind of NVM cell, such as an NVM cell having a charge trapping layer or an NVM cell having a stack of a floating gate and a control gate, as illustrated in FIG. 2.

Referring to FIG. 2, the semiconductor device includes an NVM cell 20 and a logic transistor 22. It is noted that the parts thereof in the substrate are omitted for simplicity. The NVM cell 10 includes a charge storage structure 202, a control gate 206 on the charge storage structure 202, and so on. The charge storage structure 202 may have therein a charge trapping layer, which possibly includes SiN and is usually sandwiched between insulating layers. When the substrate includes silicon, the charge trapping layer includes SiN, the insulating layers include silicon oxide and the control gate 206 includes silicon, the NVM cell 10 becomes a well-known SONOS cell.

The charge storage structure 202 may alternatively have therein a floating gate that is separated from the control gate 206 and the substrate by insulating layers. The logic transistor 22 includes a gate dielectric layer 204 that is usually formed after the charge storage structure 202 that includes a charge trapping layer, a gate 208 on the gate dielectric layer 204, and so on.

A salicide layer 210 may be formed on parts of the NVM cell 20 and the logic transistor 22, including the control gate 206 of the NVM cell 20 and the gate 208 of the logic transistor 22.

Referring to FIG. 2 again, a CESL 120 having the aforementioned structure is formed on the above structure, with the aforementioned method after the above structure is provided. An ILD layer 130 is then formed covering the resulting structure.

In the above embodiments of this invention, since the first SiN layer in the CESL is formed on the logic transistor, sufficient stress can be applied to the latter to well improve the performance there. Meanwhile, since the first SiN layer is not formed on the SPNVM cell or the NVM cell having a charge trapping layer or having a stack of a floating gate and a control gate while the silicon oxide having less stress is formed on the same, the data retention capability of the NVM cell is not adversely affected.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A semiconductor device, comprising:
   a logic transistor;
   a non-volatile memory (NVM) cell; and
   a contact etching stop layer (CESL), comprising:
   a first silicon nitride layer on the logic transistor but not on the NVM cell;
   a silicon oxide layer on the first silicon nitride layer and on the NVM cell; and
   a second silicon nitride layer disposed on the silicon oxide layer over the logic transistor and disposed on the silicon oxide layer on the NVM cell.

2. The semiconductor device of claim 1, wherein the NVM cell comprises a single-poly non-volatile memory (SPNVM) cell.

3. The semiconductor device of claim 1, wherein the NVM cell comprises a memory cell comprising a charge trapping layer.

4. The semiconductor device of claim 3, wherein the charge trapping layer comprises a silicon nitride film.

5. The semiconductor device of claim 4, wherein the memory cell comprising the charge trapping layer comprises a silicon/oxide/nitride/oxide/silicon (SONOS) cell.

6. The semiconductor device of claim 1, wherein the NVM cell comprises a memory cell having a stack of a floating gate and a control gate.

7. The semiconductor device of claim 1, further comprising a self-aligned silicide (salicide) layer formed on the logic transistor and the NVM cell, wherein the first silicon nitride layer is also on the salicide layer formed on the logic transistor, and the silicon oxide layer is also on the salicide layer formed on the NVM cell.

* * * * *